United States Patent [19]

Ueno

[11] Patent Number: 4,839,537
[45] Date of Patent: Jun. 13, 1989

[54] BICMO LOGIC CIRCUIT

[75] Inventor: Masaji Ueno, Yokohama, Japan

[73] Assignee: Kabushiki Kaisha Toshiba, Kawasaki, Japan

[21] Appl. No.: 120,959

[22] Filed: Nov. 16, 1987

[30] Foreign Application Priority Data

Nov. 29, 1986 [JP] Japan .................................. 61-285077
Jun. 29, 1987 [JP] Japan .................................. 62-159884

[51] Int. Cl.⁴ ..................... H03K 19/02; H03K 17/16; H03K 19/094
[52] U.S. Cl. ................................. 307/446; 307/443; 307/451; 307/570
[58] Field of Search ............... 307/443, 446, 451, 510, 307/574, 581

[56] References Cited

U.S. PATENT DOCUMENTS

| | | | |
|---|---|---|---|
| 4,449,063 | 5/1984 | Ohmichi et al. | 307/456 |
| 4,638,186 | 1/1987 | McLaughlin | 307/446 |
| 4,683,384 | 7/1987 | Shibata et al. | 307/446 |
| 4,703,202 | 10/1987 | Enomoto et al. | 307/443 |
| 4,740,718 | 4/1988 | Matsui | 307/443 |

FOREIGN PATENT DOCUMENTS

| | | |
|---|---|---|
| 5915330A | 7/1982 | Japan . |
| 59-202730A | 5/1983 | Japan . |
| 6042935A | 8/1983 | Japan . |
| 60-217726A | 4/1984 | Japan . |

OTHER PUBLICATIONS

Electronics Industry, 7/78, vol. 4, No. 7.

Primary Examiner—John Zazworsky
Assistant Examiner—M. R. Wambach
Attorney, Agent, or Firm—Foley & Lardner, Schwartz, Jeffery, Schwaab, Mack, Blumenthal & Evans

[57] ABSTRACT

A logic circuit comprises an input section for inputting a signal and outputting an output signal through a CMOS inverter circuit; an output section having first darlington-connected bipolar transistors and a bipolar transistor to the first bipolar transistors in the shape of a totem pole, and outputting a logic signal with respect to the input signal based on the operations of the first and second bipolar transistors; and a control section having CMOS transistors operated on the basis of the ouptut signal of the input section, and controlling the operations of the first and second bipolar transistors of the output section through the CMOS transistors in accordance with the output signal of the input section.

7 Claims, 5 Drawing Sheets

BICMO LOGIC CIRCUIT

The present invention relates to a logic circuit using bipolar transistors and CMOS transistors to reduce cost in electric power and provide drive ability for high load and to perform their operations at a high speed.

BACKGROUND OF THE INVENTION

In a conventional logic circuit there are various kinds of circuit systems including those constituted by bipolar transistors and CMOS transistors.

FIG. 1 is a diagram of a NAND gate circuit constituted by bipolar transistors. With respect to the NAND gate shown in FIG. 1, an input stage having two input terminals A and B which include diode transistor logic having diodes $D_1$ and $D_2$ and schottky transistors (referred to as S transistors in the following description) $Q_1$ and $Q_2$ of NPN type, and an output stage which has an S transistor $Q_3$ and a bipolar transistor $Q_4$ (referred to as a B transistor in the following description) of NPN type which are darlington-connected to each other. The output stage also has an S transistor $Q_5$ connected to the transistors $Q_3$ and $Q_4$. An output terminal OUT is connected to the connecting point between the B transistor $Q_4$ and the S transistor $Q_5$.

When the logic gate is configured by the B transistor, a logic gate having drive ability for high load and operated at a high speed can be provided by a large transfer conductance of the B transistor which is one of the characteristics thereof.

In FIG. 1, when both the input terminals A and B are in a high level state of voltage, the S transistor $Q_1$ is turned on so that an electric path is formed from a voltage source $V_{cc}$ through a resistor $R_1$, S transistor $Q_1$ and a resistor $R_2$ to ground. Further, the S transistor $Q_2$ is turned on so that an electric current flows along a path from the voltage source $V_{cc}$ through a resistor $R_3$, S transistor $Q_2$ to the base terminal of S transistor $Q_5$. When either one of the input terminals A and B is in a low level state of voltage, e.g., the input terminal A is in the low level state, an electric current flows along a path from the voltage source $V_{cc}$ through a resistor $R_4$ to a diode $D_1$.

Accordingly, even when the circuit is in the stationary state, the electric current path mentioned above is formed in the circuit so that the power consumption is increased. When the electric current is reduced to decrease the power consumption, the circuit is not operated at a high speed. Therefore, the circuit has been constructed by CMOS transistors to operate the circuit at a high speed and reduce the power consumption.

FIG. 2 is a diagram of a NAND gate circuit configured by CMOS transistors. In the NAND gate circuit, an input stage having two input terminals C and D is constructed by a P channel MOS transistor $P_1$ (referred to as PMOS in the following description) and N channel MOS transistors (referred to as NMOS in the following description) $N_1$ and $N_2$ connected in series to each other, a PMOS transistor $P_2$, an NMOS transistor $N_3$ and an NMOS transistor $N_4$ which are connected in series to each other and connected in parallel to PMOS transistor $P_1$, NMOS transistor $N_1$ and NMOS transistor $N_2$. An output stage of the NAND gate circuit is constructed by an inverter circuit composed of a PMOS transistor $P_3$ and an NMOS transistor $N_5$, an inverter circuit composed of a PMOS transistor $P_4$ and an NMOS transistor $N_6$, and further cascade-connected to the former inverter circuit. An input protecting circuit constituted by diodes $D_3$, $D_4$ of PN junction and a resistor $R_5$, and diodes $D_5$ and $D_6$ of PN junction and a resistor $R_6$, is connected to the respective input terminals C and D.

When the logic circuit is constructed by the CMOS transistors as mentioned above, the current drive ability is reduced and it is difficult to operate the circuit at a high speed since the transfer conductance of the MOS transistor is smaller than that of the bipolar transistor. Accordingly, the output stage of the logic circuit is constructed by inverter circuits having the increased sizes of transistors and being cascade-connected to each other.

However, in such a logic circuit constructed as above, an output signal is delayed by a transfer delay time $t_{pd}$ of the inverter circuits cascade-connected to each other. Further, when the sizes of the transistors at the output stage are increased, the circuit is increased in size, which is disadvantageous in specifically providing a compact circuit by integration.

Further, when the sizes of the transistors at the output stage are increased, the ON resistances of the transistors are reduced. Accordingly, when an output signal is overshot or undershot, the ON resistances of the transistors cannot absorb the overshoot or undershoot of the output signal in a resonant circuit formed by an inductance component of a wiring connected to an output terminal OUT and a capacity component of a load, thereby generating ringing and causing an error in operation in the worst case.

Therefore, the input protecting circuit of the diodes of the PN junction and resistor is connected to the input terminals C and D, and is efficient with respect to surge noise. However, it is difficult to sufficiently restrict the ringing since the voltage drop $V_F$ in the forward direction of the diodes of PN junction is about 0.7 volt.

As mentioned above, when the logic gate is constructed by bipolar transistors, the load-drive ability and the speed of operation are improved, but the power consumption is increased, and the speed of operation is reduced when the power consumption is reduced.

When the logic gate is constructed by only CMOS transistors, the power consumption can be reduced, but the load-drive ability is reduced and it is difficult to operate the circuit at a high speed. When the sizes of the transistors at the output stage are increased to improve the load-drive ability, the structure of the circuit is increased in size and it is difficult to sufficiently restrict the ringing. Therefore, in such constructions, it is difficult to reduce power consumption, improve load-drive ability and speed in operation, and restrict ringing.

SUMMARY OF THE INVENTION

To solve the problems mentioned above, an object of the present invention is to provide a logic circuit for reducing power consumption, improving load-drive ability and speed in operation, and restricting ringing.

With the above object in view, the present invention resides in a logic circuit comprising an input section for outputting a signal by reversing an input signal by a CMOS inverter, an output section having bipolar transistors darlington-connected to each other and a bipolar transistor connected to these bipolar transistors the output section outputting logically operated results with respect to the input signal from the connection point of the connected bipolar transistor, and a control section having CMOS transistors and a transistor for discharging a base charge of the darlington-connected bipolar transistors and the connected bipolar transistor when the output signal of the output section is changed from a low level of voltage to a high level, the control section controlling the operations of the respective bipolar transistors of the output section in accordance with the output signal of the input section.

In the logic circuit of the present invention, the operations of the bipolar transistors connected to each other and constituting the output section are controlled by the control section having the CMOS transistors. The base charge of one of the bipolar transistors is discharged through the transistors constituting the control section, thereby reducing a through electric current flowing through the output section and reducing the power consumption and performing logic operation with respect to the input signal.

BRIEF DESCRIPTION OF THE DRAWINGS

The present invention will be more apparent from the following preferred embodiments thereof in conjunction with the accompanying drawings in which.

DETAILED DESCRIPTION OF THE PREFERRED EMBODIMENTS

The preferred embodiments of the present invention will now be described with reference to the accompanying drawings.

Figure 1:
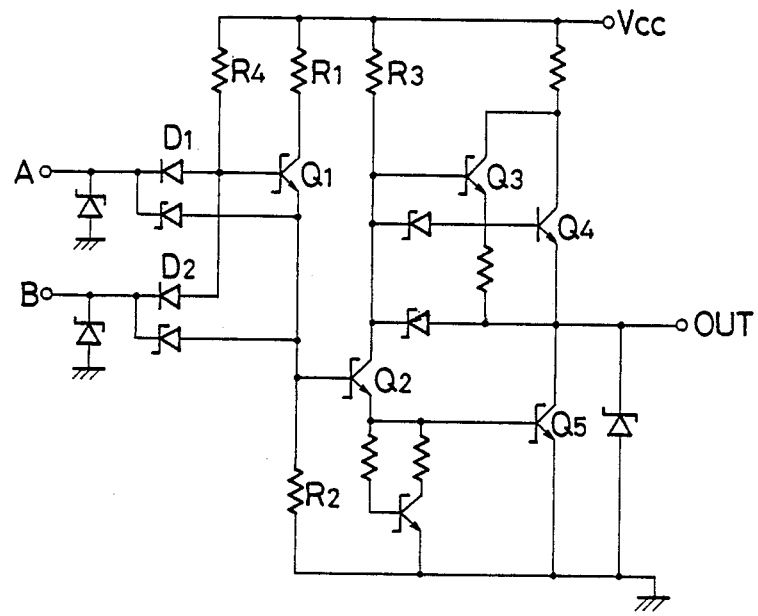
FIG. 1 is a diagram of a conventional logic circuit constituted by bipolar transistors.
Figure 2:
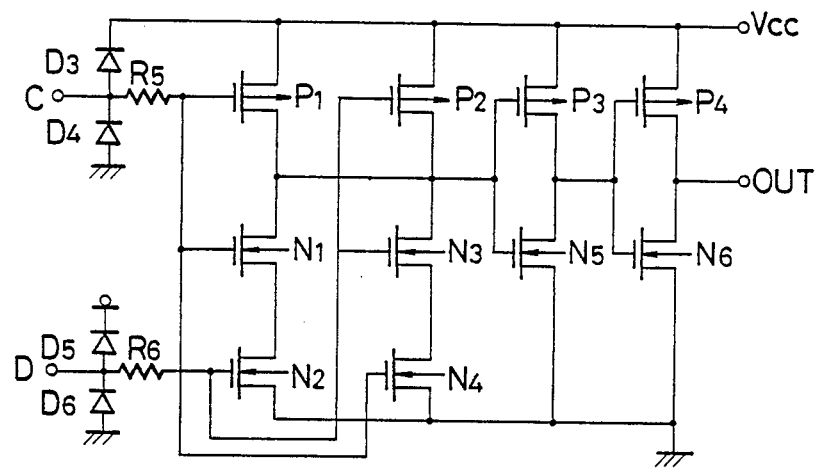
FIG. 2 is a diagram of another conventional logic circuit constituted by CMOS transistors.
Figure 3:
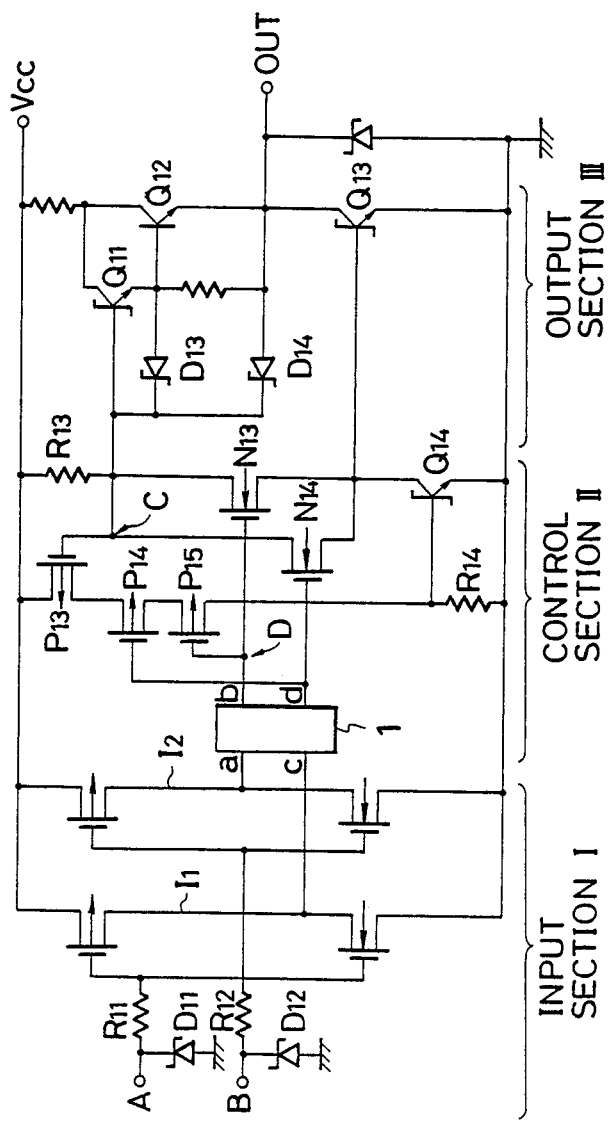
FIG. 3 is a diagram showing the construction of a logic circuit according to a first embodiment of the present invention.

FIG. 3 is a diagram showing the construction of a logic circuit in according with a first embodiment of the present invention. In FIG. 3, the logic circuit is consituted by a mixture of bipolar transistors and CMOS transistors, and comprises an input section I, a control section II having CMOS transistors, and an output section III composed of bipolar transistors, constituting an AND gate or NOR gate having two input terminals A and B.

In FIG. 3, the input section I has inverter circuits $I_1$ and $I_2$ composed of PMOS and NMOS transistors. The input terminal A is connected to an input of the inverter circuit $I_1$ through an input protecting circuit composed of a schottky diode (referred to as an S diode in the following description) $D_{11}$ and a resistor $R_{11}$. The input terminal B is connected to an input of the inverter circuit $I_2$ through an input protecting circuit composed of an S diode $D_{12}$ and a resistor $R_{12}$.

The control section II controls the operation of the output section described later, and comprises a switching circuit 1 for operating the logic gate shown in FIG. 3 as an AND gate or NOR gate, PMOS transistors $P_{13}$, $P_{14}$ and $P_{15}$ connected in series to each other, NMOS transistors $N_{14}$ and $N_{15}$ connected in parallel to each other, and an S transistor $Q_{14}$ and a resistor $R_{14}$.

When the logic gate is operated by the switching circuit 1 as an AND gate, an input terminal a and an output terminal b, and an input terminal c and an output terminal d are respectively short-circuited therebetween. When the logic gate is operated by the switching circuit 2 as a NOR gate, inverter circuits are respectively inserted between the input and output terminals a and b, and the input and output terminals c and d.

The gate terminals of the PMOS transistor $P_{15}$ and the NMOS transistor $N_{13}$ are connected to an output of the inverter circuit $I_2$ through the switching circuit 1. The gate terminals of the PMOS transistor $P_{14}$ and the NMOS transistor $N_{14}$ are connected to an output of the inverter circuit $I_1$ through the switching circuit 1. The gate terminal of the PMOS transistor $P_{13}$ is connected to the drain terminals of the NMOS transistors $N_{13}$ and $N_{14}$.

The S transistor $Q_{14}$ is disposed to discharge the base charge of the S transistor $Q_{13}$ constituting the output section III described later, and is inserted between ground and the source terminals of the NMOS transistors $N_{13}$ and $N_{14}$. The base terminal of the S transistor $Q_{14}$ is connected to the drain terminal of the PMOS transistor $P_{15}$ and is connected to ground through a resistor $R_{14}$.

The output section III has an S transistor $Q_{11}$ and a B transistor $Q_{12}$ darlington-connected to each other, and an S transistor $Q_{13}$ connected to the transistors $Q_{11}$ and $Q_{12}$ in the shape of a totem pole. An output terminal OUT is connected to the connection point between the B transistor $Q_{12}$ and the S transistor $Q_{13}$. The base terminal of the S transistor $Q_{11}$ is connected to a voltage source $V_{cc}$ through a resistor $R_{13}$, and is connected to the drain terminals of the NMOS transistors $N_{13}$ and $N_{14}$. The base terminal of the S transistor $Q_{12}$ is connected to the base terminal of the S transistor $Q_{11}$ through an S diode $D_{13}$. The base terminal of the S transistor $Q_{13}$ is connected to the source terminals of the NMOS transistors $N_{13}$ and $N_{14}$.

Figure 4:
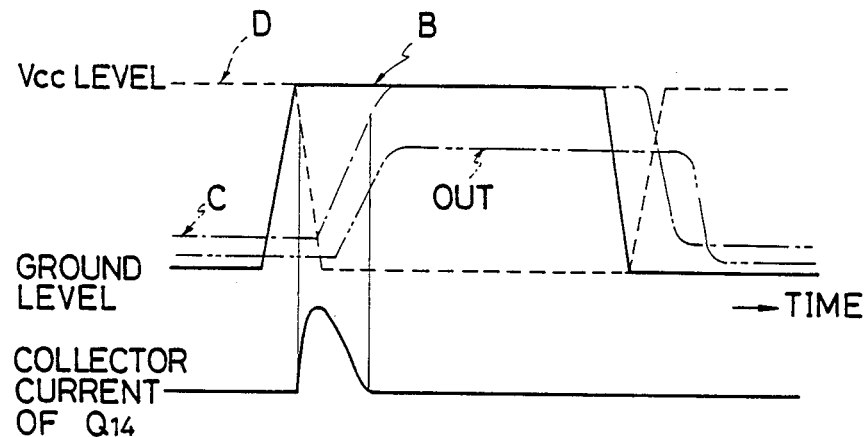
FIG. 4 is a view showing waveforms of signals in operation of the logic circuit of FIG. 3.

The operation of the logic circuit in the first embodiment of the present invention mentioned above will now be described with reference to FIG. 4 showing waveforms of signals in FIG. 3.

In the following description, the input and output terminals a and b, and the input and output terminals c and d are respectively short-circuited in the switching circuit 1, and the logic gate in FIG. 3 is operated as an AND gate.

When the input terminal A is in a high level state of voltage, an output of the inverter circuit $I_1$ becomes a low level state of voltage, and the PMOS transistor $P_{14}$ is turned on, the NMOS transistor $N_{14}$ is turned off, and the potential of the output terminal OUT in this state is changed as follows.

Namely, in such a state, when the input terminal B is in the low level state, an input of the inverter circuit $I_2$, i.e., the potential at point D is in the high level state, and the NMOS transistor $N_{13}$ is turned on. Accordingly, the S transistor $Q_{11}$ and the B transistor $Q_{12}$ are turned off, the S transistor $Q_{13}$ is turned on and its output is in the low level state.

When the input terminal B is changed from the low level to the high level, the potential at point D begins to be decreased from the high level to the low level. The PMOS transistor $P_{15}$ is turned on when the potential at point D becomes less than a potential which is the source potential $V_{S15}$ of the PMOS transistor $P_{15}$ minus a threshold voltage $V_{T15}$ of the PMOS transistor $P_{15}$. Thus, an electric current is supplied from a voltage source $V_{cc}$ to the base terminal of the S transistor $Q_{14}$ through the PMOS transistors $P_{13}$, $P_{14}$ and $P_{15}$ so that the S transistor $Q_{14}$ is turned on. Accordingly, the base charge of the S transistor $Q_{13}$ is discharged to ground through the S transistor $Q_{14}$ so that the S transistor $Q_{13}$ is rapidly turned off.

When the S transistor $Q_{14}$ is turned on, an electric current flows along a path from the resistor $R_{13}$ through the NMOS transistor $N_{13}$ to the S transistor $Q_{14}$. The time at which the S transistor $Q_{14}$ is turned on is delayed by making the electric current, which begins to be supplied to the base terminal of the S transistor $Q_{14}$, to flow through the resistor $R_{14}$, thereby reducing a through electric current flowing through the transistors $Q_{12}$ and $Q_{13}$.

The NMOS transistor $N_{13}$ is turned on until the potential at point D is further reduced and has become a voltage which is a voltage $V_{BE13}$ between the base and emitter of the S transistor $Q_{13}$ plus a threshold voltage $V_{T13}$ of the NMOS transistor $N_{13}$. However, the drain current of the NMOS transistor $N_{13}$ begins to be gradually reduced since the voltage between the gate and source thereof is reduced. When the potential at point D has reached the voltage $(V_{BE13}+V_{T13})$, the NMOS transistor $N_{13}$ is turned off. The potential at point C is increased in accordance with a time constant between the resistor $R_{13}$, the drains of the NMOS transistors $N_{13}$ and $N_{14}$, and the parasitic capacities in the S diodes $D_{13}$ and $D_{14}$.

When the potential at point C is increased, the S transistor $Q_{11}$ is turned on so that the B transistor $Q_{12}$ is turned on and the output terminal OUT is changed from the low level state to the high level state. When the potential at point C is further increased and has become greater than voltage $V_{cc}-V_{T13}$ which is the threshold voltage of the PMOS transistor $P_{13}$, the PMOS transistor $P_{13}$ is turned off. Thus, the electric current is not supplied to the base terminal of the S transistor $Q_{14}$, and the charge accumulated in this base terminal is discharged to ground through the resistor $R_{14}$ so that the S transistor $Q_{14}$ is turned off.

Accordingly, when the output terminal OUT is changed from the low level state to the high level state, the base charge of the S transistor $Q_{13}$ is discharged to ground through the S transistor $Q_{14}$, thereby reducing the through electric current flowing from the voltage source $V_{cc}$ through the B transistor $Q_{12}$ and the S transistor $Q_{13}$ to ground.

In such a state, when the input terminal B is changed to the low level state, the potential at point D begins to be increased from the low level to the high level so that the NMOS transistor $N_{13}$ is turned on and an electric current begins to flow through the NMOS transistor $N_{13}$. Thus, when the potential at point C begins to be decreased and has become less than the threshold voltage $V_{cc}-V_{T13}$ of the PMOS transistor $P_{13}$, the PMOS transistor $P_{13}$ is turned on, and all of the PMOS transistors $P_{13}$, $P_{14}$ and $P_{15}$ are temporarily turned on. However, the potential at point D is increased and the PMOS transistor $P_{15}$ is immediately thereafter turned off so that all of the PMOS transistors $P_{13}$, $P_{14}$ and $P_{15}$ are turned on for a very short time.

The electric current, which is the voltage $V_{BE}$ between the base and emitter of the S transistor $Q_{14}$ divided by the resistance R of the resistor $R_{14}$, in the electric current flowing through the base terminal of the S transistor $Q_{14}$ is absorbed by the resistor $R_{14}$. Accordingly, the S transistor $Q_{14}$ is held to be turned off.

Accordingly, an electric current is supplied to the base terminal of the S transistor $Q_{13}$ from the voltage source $V_{cc}$ through the resistor $R_{13}$ and the NMOS transistor $N_{13}$. Further, the base charge of the B transistor $Q_{12}$ is supplied through the S diode $D_{13}$ and the charge of the output terminal OUT is supplied through the S diode $D_{14}$. Thus, the S transistor $Q_{13}$ is turned on and the S transistor $Q_{11}$ and the B transistor $Q_{12}$ are turned off, and the output terminal OUT is changed from the high level state to the low level state.

The same results as above can be provided even when the input terminal B is in the high level state and the state of the input terminal A is changed, and can further be provided even when inverter circuits are inserted between the input and output terminals a and b, and between the input and output terminals c and d of the switching circuit 1.

Although the bipolar transistors are used in the above logic circuit, the electric current in the active and normal states in the circuit is greatly reduced, and the power consumption can be approximately reduced to the one in a circuit constructed by only CMOS transistors. Further, since the output stage is constructed by the bipolar transistors, the high load drive ability can be obtained and the speed in operation can become high. Further, the ON resistance of the bipolar transistors at the output stage can restrict the ringing since the electric current-voltage characteristics thereof are not linear ones and the ON resistance is greater than that of a CMOS transistor having a similar drive ability.

Further, the input protecting circuit in the logic circuit of the present invention is constituted by the S diode which is fast in response and which has a small voltage drop in the forward direction in comparison with diode of PN junction. Therefore, the ringing, which tends to be generated when the wiring connected to the input terminal is long, can be restricted in comparison with an input protecting circuit using the diode of the PN junction.

In the construction of the logic circuit shown in FIG. 3, both the PMOS transistors $P_{14}$ and $P_{15}$ are changed to be turned on in accordance with input change in the following two cases.

(1) When the output terminal d of the switching circuit 1 is in the low level state and the PMOS transistor $P_{14}$ is turned on, the output terminal b of the switching circuit 1 is changed from the high level state to the low level state and the PMOS transistor $P_{15}$ is changed from the turning-off state to the turning-on state.

(2) When the output terminal b of the switching circuit 1 is in the low level state and the PMOS transistor $P_{15}$ is turned on, the output terminal d of the switching circuit 1 is changed from the high level state to the low level state and the PMOS transistor $P_{14}$ is changed from the turning-off state to the turning-on state.

In item (1), since the PMOS transistor $P_{14}$ is turned on, the voltage $V_{DS}$ between the source and drain of the PMOS transistor $P_{14}$ is 0 volt. Further, since the NMOS transistor $N_{13}$ is turned on and the PMOS transistor $P_{13}$ is turned on, the potential of the source of the PMOS transistor $P_{15}$ is equal to the potential of the voltage source $V_{cc}$. Accordingly, when the potential of the gate of the PMOS transistor $P_{15}$ is changed from the high level state to the low level state, the PMOS transistor $P_{15}$ is rapidly turned on, thereby rapidly performing the switching operation from the turning-off state to the turning-on state.

In item (2), since the PMOS transistor $P_{14}$ is turned off, the potential of the source of the PMOS transistor $P_{15}$ is equal to the threshold potential of the PMOS transistor $P_{15}$ so that the PMOS transistor $P_{15}$ is in the cutoff state. Accordingly, when the potential of the gate of the PMOS transistor $P_{14}$ is changed from the high level state to the low level state, the potential of the source of the PMOS transistor $P_{15}$ is increased and the voltage $V_{GS}$ between the gate and source of the PMOS transistor $P_{15}$ is increased after the PMOS transistor $P_{14}$ has been turned on.

Accordingly, with respect to the input change in item (2), the PMOS transistor $P_{15}$ is turned on after the PMOS transistor $P_{14}$ has been turned on, and the switching operation from the turning-off state to the turning-on state is slightly delayed in comparison with the case of item (1), thereby generating differences with respect to the response characteristics of the logic circuit at the time of the high level output.

Figure 5:
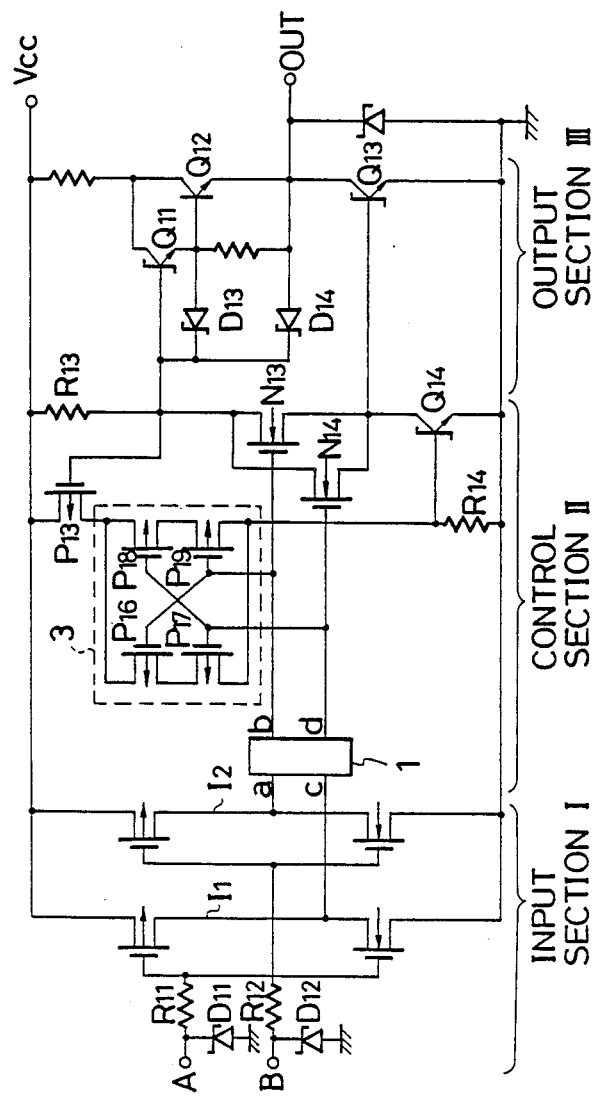
FIG. 5 is a diagram showing the construction of a logic circuit according to a second embodiment of the present invention.

FIG. 5 shows a second embodiment of the present invention constructed such that the response characteristics become the same as mentioned above. FIG. 5 is a diagram showing the construction of a logic circuit in accordance with the second embodiment of the present invention in which the PMOS transistors $P_{14}$ and $P_{15}$ shown in FIG. 3 are replaced by a same threshold circuit 3 enclosed by a dotted line of FIG. 5 in which the threshold values are the same. The other construction of FIG. 5 is similar to the construction of the logic circuit shown in FIG. 3, and therefore the same reference numerals in FIG. 5 are the same or corresponding portions in FIG. 3.

In FIG. 5, the same threshold circuit 3 is constituted by four PMOS transistors $P_{16}$, $P_{17}$, $P_{18}$ and $P_{19}$.

The PMOS transistors $P_{16}$ and $P_{17}$ are connected in series to each other between the drain terminal of the PMOS transistor $P_{13}$ and the base terminal of the S transistor $Q_{14}$. The gate terminal of the PMOS transistor $P_{16}$ is connected to the output terminal b of the switching circuit 1, and the gate terminal of the PMOS transistor $P_{17}$ is connected to the output terminal d of the switching circuit 1.

The PMOS transistors $P_{18}$ and $P_{19}$ are connected in parallel to the PMOS transistors $P_{16}$ and $P_{17}$, and connected in series to each other, and are connected in series to each other between the drain terminal of the PMOS transistor $P_{13}$ and the base terminal of the S transistor $Q_{14}$. The gate terminal of the PMOS transistor $P_{18}$ is connected to the output terminal d of the switching circuit 1, and the gate terminal of the PMOS transistor $P_{19}$ is connected to the output terminal b of the switching circuit 1.

The operation of the same threshold circuit 3 constructed as above will now be described when the PMOS transistors $P_{16}$ and $P_{17}$, and the PMOS transistors $P_{18}$ and $P_{19}$ connected in series to each other are respectively turned on. In this case, in the switching circuit 1, the input and output terminals a and b, and the input and output terminals c and d are respectively short-circuited to operate the logic circuits as AND gate.

First, the input terminal A is in the high level state, and the input terminal B is in the low level state. The operation of the logic circuit will be described in these states when the input terminal B is changed from the low level state to the high level state.

When the input terminal A is in the high level state and the input terminal B is in the low level state, the output terminal b of the switching circuit 1 is in the high level state and the output terminal d thereof is in the low level state, and the PMOS transistors $P_{16}$ and $P_{19}$ are turned off, and the PMOS transistors $P_{17}$ and $P_{18}$ are turned on. Accordingly, the potential of the source of the PMOS transistor $P_{17}$ is equal to the threshold voltage of the PMOS transistor $P_{17}$, and the potential of the source of the PMOS transistor $P_{19}$ is equal to the potential of the voltage source.

In such a state, when the input terminal B is in the high level state, the output terminal b of the switching circuit 1 is changed from the high level state to the low level state, and the PMOS transistors $P_{16}$ and $P_{19}$ are changed from the turning-off state to the turning-on state.

At this time, since the potential of the source of the PMOS transistor $P_{19}$ is equal to the potential of the voltage source, the PMOS transistors $P_{18}$ and $P_{19}$ are turned on before the PMOS transistor $P_{16}$ is changed from the turning-off state to the turning-on state and both the PMOS transistors $P_{16}$ and $P_{17}$ are turned on. Therefore, the electric current flowing out of the voltage source $V_{cc}$ through the PMOS transistor $P_{13}$ is supplied to the base terminal of the S transistor $Q_{14}$ through the PMOS transistors $P_{18}$ and $P_{19}$ immediately after the output terminal b of the switching circuit 1 is changed from the high level state to the low level state.

Next, the input terminal A is in the low level state, and the input terminal B is in the high level state, and the operation of the logic circuit will be described in these states when the input terminal A is changed from the low level state to the high level state.

When the input terminal A is in the low level state and the input terminal B is in the high level state, the output terminal b of the switching circuit 1 is in the low level state and the output terminal d thereof is in the high level state, and the PMOS transistors $P_{16}$ and $P_{19}$ are turned on, and the PMOS transistors $P_{17}$ and $P_{18}$ are turned off. Accordingly, the potential of the source of the PMOS transistor $P_{19}$ is equal to the threshold potential of the PMOS transistor $P_{19}$.

In such a state, when the input terminal A is changed from the low level state to the high level state, the output terminal d of the switching circuit 1 is changed from the high level state to the low level state, and the PMOS transistors $P_{17}$ and $P_{18}$ are changed from the turning-off state to the turning-on state.

At this time, since the potential of the source of the PMOS transistor $P_{17}$ is equal to the potential of the voltage source, the PMOS transistors $P_{16}$ and $P_{17}$ are turned on before the PMOS transistor $P_{18}$ is changed from the turning-off state to the turning-on state, and both the PMOS transistors $P_{18}$ and $P_{19}$ are turned on. Therefore, the electric current flowing out of the voltage source $V_{cc}$ through the PMOS transistor $P_{13}$ is supplied to the base terminal of the S transistor $Q_{14}$ through the PMOS transistors $P_{16}$ and $P_{17}$ immediately after the output terminal d of the switching circuit 1 is changed from the high level state to the low level state.

As mentioned above, there is the first case in which both the input terminals A and B are changed to the high level state by changing the input terminal A from the low level state to the high level state, and the second case in which both the input terminals A and B are changed to the high level state by changing the input terminal B from the low level state to the high level state. The PMOS transistors changing from the turning-off state to the turning-on state in the same threshold circuit 3 are different from each other with respect to the first and second cases, but the same threshold circuit 3 is symmetrically constructed with respect to the output terminals b and d of the switching circuit 1. Accordingly, the same threshold circuit 3 is similarly operated in the first and second cases in that the electric current is supplied to the base terminal of the S transistor $Q_{14}$ from the voltage source $V_{cc}$.

Accordingly, the logic circuit in the second embodiment has the effects similar to the ones of the first embodiment, and the responsive speed of the same threshold circuit 3 can be the same irrespective of change of the input level, and the responsive characteristics of the logic circuit at the time of the high level output can be same.

The similar effects can be obtained even when inverter circuits are respectively connected between the input and output terminals a and b, and between the input and output terminals c and c of the switching circuit 1, and the logic circuit is operated as a NOR gate.

Figure 6:
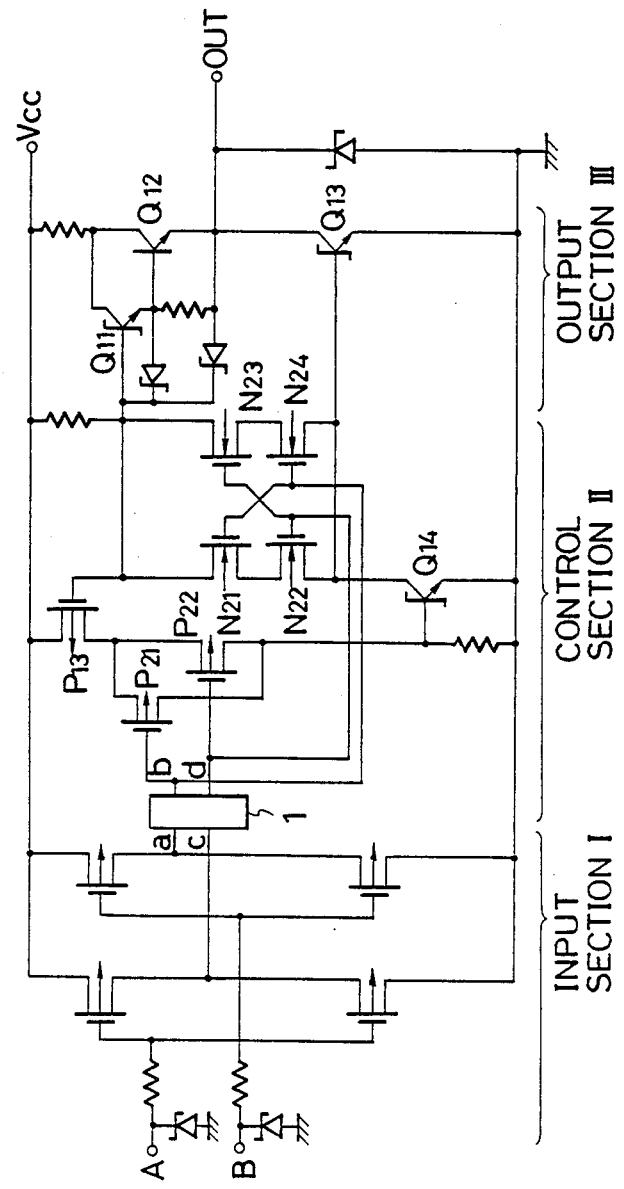
FIG. 6 is a diagram showing the construction of a logic circuit according to a third embodiment of the present invention.

FIG. 6 is a diagram showing the construction of a logic circuit in accordance with a third embodiment of the present invention.

In FIG. 3, the drain terminal of the PMOS transistor $P_{13}$ and the base terminal of the S transistor $Q_{14}$ are connected to each other through the PMOS transistors $P_{14}$ and $P_{15}$ connected in series to each other. In contrast to FIG. 3, in the logic circuit of FIG. 6, the drain terminal of the PMOS transistor $P_{13}$ and the base terminal of the S transistor $Q_{14}$ are connected to each other through PMOS transistors $P_{21}$ and $P_{22}$ which are connected in parallel to each other. The gate terminal of the PMOS transistor $P_{21}$ is connected to the output terminal b of the switching circuit 1, and the gate terminal of the PMOS transistor $P_{22}$ is connected to the output terminal d of the switching circuit 1. Accordingly, the logic circuit is operated as an OR gate by the switching circuit 1 in which the input and output terminals a and b, and the input and output terminals c and d are respectively short-circuited, and the logic circuit is operated as a NAND gate by the switching circuit 1 in which inverter circuits are respectively inserted between the input and output terminals a and b, and between the input and output terminals c and d of the switching circuit 1.

Further, in FIG. 3, the base terminals of the respective S transistors $Q_{11}$ and $Q_{13}$ are connected to each other through the NMOS transistors $N_{13}$ and $N_{14}$ which are connected in parallel to each other. In contrast to FIG. 3, in the logic circuit of FIG. 6, NMOS transistors $N_{21}$ and $N_{22}$ are connected in series to each other, and NMOS transistors $N_{23}$ and $N_{24}$ connected in series to each other, and connected in parallel to each other between the base terminals of the respective S transistors $Q_{11}$ and $Q_{13}$. The gate terminals of the NMOS transistors $N_{21}$ and $N_{24}$ are connected to the output terminal b of switching circuit 1, and the gate terminals of the NMOS transistors $N_{22}$ and $N_{23}$ are connected to the output terminal d of the switching circuit 1. According to such a construction, the switching operation of the S transistor $Q_{13}$ is not changed irrespective of the output change of the switching circuit 1.

In the construction of the logic circuit constructed above, the same effects as the ones in the first embodiment can be obtained even when the logic circuit of FIG. 6 is operated as an OR gate or a NAND gate, and the responsive characteristics of the logic circuit can be the same with respect to the output change of the switch circuit 1.

Figure 7:
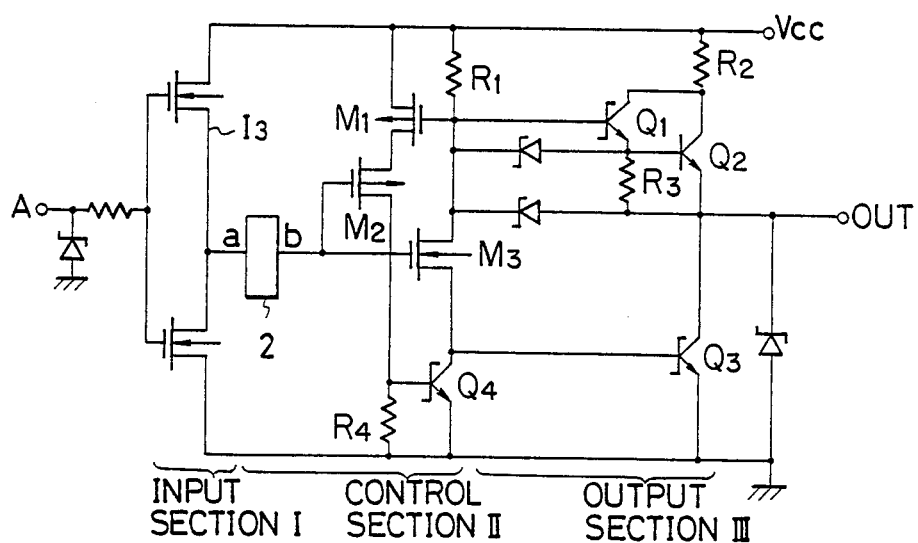
FIG. 7 is a diagram showing the construction of a logic circuit according to a fourth embodiment of the present invention.

FIG. 7 is a diagram showing the construction of a logic circuit in accordance with a fourth embodiment of the present invention and includes bipolar transistors $Q_1-Q_4$, PMOS $M_1$ and $M_2$, NMOS $M_3$, and resistors $R_1-R_4$. In contrast to FIG. 3, the logic circuit of FIG. 7 is operated as a buffer circuit by constituting the input section I by one inverter circuit $I_3$, and by short-circuiting input and output terminals a and b of a switching circuit 2 therebetween, and is operated as inverter circuit by inserting an inverter circuit between the input and output terminals a and b. The switching operation of an output signal is similar to the one in FIG. 3.

According to the construction of the logic circuit mentioned above, the effects similar to the ones in the first embodiment of FIG. 3 can be obtained even in a buffer circuit or an inverter circuit.

In the logic circuits in the first to fourth embodiments of the present invention, the inverter circuits $I_1$, $I_2$ and $I_3$ receiving an input signal are constituted by CMOS transistors, and the level of the input signal is equal to the levels of the CMOS transistors. However, the input signal at the transistor-transistor logic level can be also used by setting the threshold voltage of PMOS transistors constituting the inverter circuits $I_1$, $I_2$ and $I_3$ higher than the normal voltage such as about 0.8 volt.

As mentioned above, according to the present invention, the operation of bipolar transistors constituting an output section and connected to each other is controlled by a control section having CMOS transistors, and the base charge of one of the bipolar transistors is discharged through a transistor constituting the control section when the bipolar transistors are switched, thereby reducing a through electric current flowing through the output section. Accordingly, in the logic circuit of the present invention, power consumption can be reduced, high load drive ability can be obtained, and the operation can be performed at a high speed.

Further, since the output section is constituted by using the bipolar transistors, the ringing generated in an output terminal can be sufficiently restricted.

What is claimed is:

1. A logic circuit comprising:
   first and second bipolar transistors connected in series between a high voltage source and a low voltage source;
   an output terminal connected between an emitter terminal of said first transistor and a collector terminal of said second transistor;
   a first MOS transistor of a first channel type connected between respective base terminals of said first and second bipolar transistors;
   an element having a first terminal connected to said high voltage source and a second terminal connected to the base terminal of said first bipolar transistor for increasing voltage level at the base terminal of said first bipolar transistor when said first MOS transistor is turned off and decreasing the voltage level at the base terminal of said first bipolar transistor when said first MOS transistor is turned on;

a third bipolar transistor connected between the base terminal of said second bipolar transistor and said low voltage source; and a second MOS transistor of a second channel type opposite to said first channel type and a third MOS transistor connected to said second MOS transistor in series, a base terminal of said second MOS transistor being supplied with a logical input signal, said third MOS transistor having a base terminal connected to the base terminal of said first or second bipolar transistors and being adapted to be turned on when said first MOS transistor is turned on and to be turned off when said first MOS transistor is turned off.

2. The logic circuit of claim 1 wherein said first bipolar transistor is part of a circuit comprising a darlington pair.

3. The logic circuit of claim 1 further comprising a resistor connected between the base terminal of said third bipolar transistor and said low voltage source.

4. The logical circuit of claim 1, wherein said element is a resistor.

5. The logic circuit of claim 1 further comprising a fourth MOS transistor of said first channel type connected in parallel with said first MOS transistor, a base terminal of said fourth MOS transistor being supplied with a second logical input signal, and a fifth MOS transistor of said second channel type connected in series between said second and third MOS transistors, a base terminal of said fifth MOS transistor being supplied with said second logical input signal.

6. The logic circuit of claim 1 further comprising a fourth MOS transistor of said first channel type connected in parallel with said first MOS transistor, a base terminal of said fourth MOS transistor being supplied with a second logical input signal, and wherein said second MOS transistor is part of a circuit comprising a fifth MOS transistor connected in series with said second MOS transistor, said second and fifth MOS transistors being connected in parallel with sixth and seventh MOS transistors which are connected in series to each other, respective bases of said fifth and sixth MOS transistors being supplied with said second logical input signal and said seventh MOS transistor being supplied with said logical input signal supplied to said second MOS transistor.

7. The logic circuit of claim 1 further comprising a fourth MOS transistor of said second channel type connected in parallel to said second MOS transistor, a base terminal of said fourth MOS transistor being supplied with a second logical input signal, and wherein said first MOS transistor is part of a circuit which includes a fifth MOS transistor connected in series to said first MOS transistor, said first and fifth MOS transistors being connected in parallel to sixth and seventh MOS transistors which are connected in series to each other, and wherein respective base terminals of said fifth and seventh MOS transistors being supplied with said second logical input signal and respective base terminals of said first and sixth MOS transistors being supplied with the logical input signal supplied to said second MOS transistor.

* * * * *